(12) United States Patent
Crochemore et al.

(10) Patent No.: US 6,239,727 B1
(45) Date of Patent: May 29, 2001

(54) DATA ENCODING/DECODING PROCESS

(75) Inventors: Maxime Crochemore, Noisy le Grand (FR); Filippo Mignosi, Palermo (IT); Antonio Restivo, Palermo (IT); Sergio Salemi, Palermo (IT)

(73) Assignee: Universita' Degli Studi di Palmero, Palmero (IT)

( * ) Notice: Subject to any disclaimer, the term of this patent is extended or adjusted under 35 U.S.C. 154(b) by 0 days.

(21) Appl. No.: 09/329,803

(22) Filed: Jun. 10, 1999

(51) Int. Cl.[7] .................................................... H03M 7/34
(52) U.S. Cl. .............................. 341/51; 341/51; 341/55; 341/67; 341/63
(58) Field of Search ................... 341/50, 51, 55, 341/63, 67

(56) References Cited

U.S. PATENT DOCUMENTS

| | | | |
|---|---|---|---|
| 5,455,577 | * 10/1995 | Slivka et al. | 341/51 |
| 5,818,873 | * 10/1998 | Wall et al. | 375/240 |
| 5,877,711 | * 3/1999 | Craft | 341/51 |
| 5,973,626 | * 10/1999 | Berger et al. | 341/65 |
| 6,088,699 | * 7/2000 | Gampper et al. | 707/10 |

* cited by examiner

*Primary Examiner*—Michael Tokar
*Assistant Examiner*—Vibol Tan
(74) *Attorney, Agent, or Firm*—Young & Thompson

(57) ABSTRACT

The invention concerns a data encoding/decoding process. In the encoding process, data are converted from a decoded state into an encoded state in which:

the data, both in the encoded state and in the decoded state, are in the form of a stream of binary information, by processing the decoded string of data from left to right, its current prefix and the next binary information being considered, a list of binary patterns being registered, in which for each is emphasized the last binary information and the corresponding prefix, a comparison is made between the current prefix of the decoded string and the prefixes of registered patterns.

The list of patterns is a set of patterns that do not occur and when a prefix of the decoded string matches with a prefix of a registered pattern, the next binary information of the decoded string is omitted from the decoded stream to make the encoded stream.

12 Claims, 2 Drawing Sheets

DATA ENCODING/DECODING PROCESS

BACKGROUND AND SUMMARY OF THE INVENTION

The invention concerns a simple text compression method that uses some "negative" information about the text, which is described in terms of antidictionaries. Contrary to other methods that use, as a main tool, dictionaries, i.e. particular sets of words occurring as factors in the text, our method takes advantage from words that do not occur as factors in the text, i.e. that are forbidden. Such sets of words are called here antidictionaries.

More particularly, our invention concerns a data encoding and a data decoding process.

In the encoding process, data are converted from a decoded state into an encoded state in which:

the data, both in the encoded state and in the decoded state, are in the form of a stream of binary information, by processing the decoded string of data from left to right, its is current prefix and the next binary information being considered, a list of binary patterns being registered, in which for each is emphasized the last binary information and the corresponding prefix, a comparison is made between the current prefix of the decoded string and the prefixes of registered patterns.

The list of patterns is a set of patterns that do not occur and that when a prefix of the decoded string matches with a prefix of a registered pattern, the next binary information of the decoded string is omitted from the decoded stream to make the encoded stream.

In the decoding process, data are converted from an encoded state into a decoded state in which:

the data, both in the encoded state and in the decoded state, are in the form of a stream of binary information, by processing the encoded string of data from left to right, its current prefix being considered, a list of binary patterns being registered, in which for each is emphasized the last binary information and the corresponding prefix, a comparison is made between the current prefix of the decoded string and the prefixes of registered patterns.

The list of patterns is a set of patterns that do not occur and that when a prefix of the decoded string matches with a prefix of a registered pattern, a binary information opposite to the next binary information of the registered matching pattern is inserted in the encoded stream to make the decoded stream.

In preferred embodiments:

the list of registered patterns is finite, patterns are binary words, an algorithm is used to compute the list of registered patterns, during the encoding process, the data stream is read a first time to construct the list of registered patterns and a second time to convert said data stream, an encoder sends a message z in the form (x, y, σ(n)) to a decoder, where x is a description of a list of the registered patterns, y is the encoded data stream and σ(n) is the usual binary code of the length n of the data stream.

BRIEF DESCRIPTION OF THE DRAWINGS

A preferred embodiment of the invention will be now more precisely described. It will refer to the drawings in which.

DESCRIPTION OF THE PREFERRED EMBODIMENTS

Figure 1:
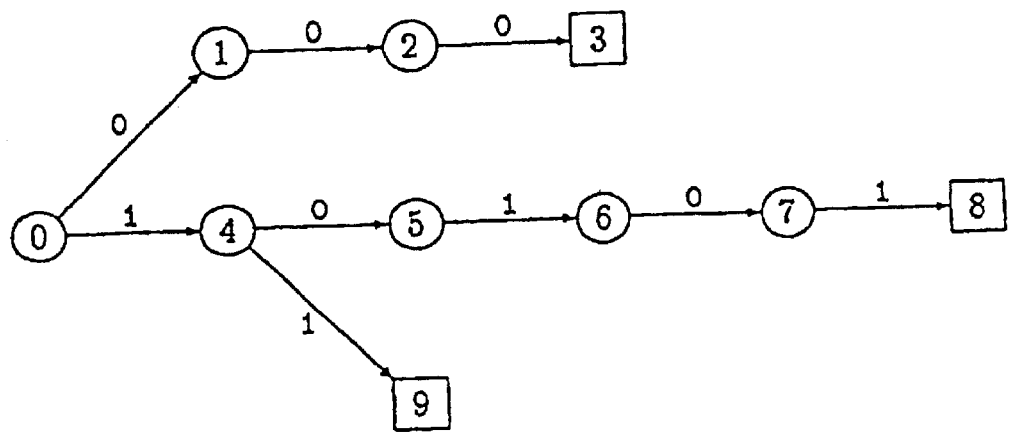
FIG. 1 is a scheme of a trie of a factor code (000, 10101, 11). Squares represent terminal states.

Let w be a text on the binary alphabet $\{0,1\}$ that is extracted out of a stream of binary decoded data, and let AD be an antidictionary for w. By reading the text w from left to right, if at a certain moment, the current prefix v of the text admits as suffix a word u' such that u=u' x ∈ AD with x ∈ $\{0,1\}$, i.e. u is forbidden, then surely the letter following v in the text cannot be x and, since the alphabet is binary, it is the letter y≠x. In other terms, we know in advance the next letter y, that turns out to be redundant or predictable. The main idea of our method is to eliminate in the encoded stream, redundant letters in order to achieve compression. The decoding algorithm recovers the text w by predicting the letter following the current prefix v of w already decompressed.

Actually, compression method of the invention erases some characters and the decompression reconstructs them.

We prove that the compression rate of this compressor reaches the entropy almost surely, provided that the source is equilibrated and produced from a finite antidictionary. This type of source approximates a large class of sources, and consequently, a variant of the basic scheme gives an optimal compression for them. The idea of using antidictionaries is founded on the fact that there exists a topological invariant for Dynamical Systems based on forbidden words and independent of the entropy.

The use of the antidictionary AD in coding and decoding algorithms requires that AD must be structured in order to answer to the following query on a word v: does there exists a word u=u' x,x ∈ $\{1,0\}$, in AD such that u' is a suffix of v? In the case of positive answer, the output should also include the letter y defined by y≠x. One of the main features of the method of the invention is that it makes it possible to implement efficiently finite antidictionaries in terms of finite automata. This leads to efficient and fast compression and decompression algorithms, which can be realized by sequential transducers (generalized sequential machines). This is especially relevant for fixed sources. It is then comparable to the fastest compression methods because the basic operation at compression and decompression time is just table lookup.

A central notion of the method of the invention is that of minimal forbidden words, which allows to reduce the size of antidictionaries. This notion has also some interesting combinatorial properties. Our compression method includes algorithms to compute antidictionaries, algorithms that are based on the above combinatorial properties and that are described in details in "Minimal Forbidden Words and Factor Automata", Crochemore-Mignosi-Restivo, Conference MFCS'98 and in "Automata and Forbidden Words, Crochemore-Mignosi-Restivo, Technical Report, IGM 98-5.

The compression method shares also an interesting synchronization property, in the case of finite antidictionaries. It states that the encoding of a block of data does not depend on the left and right contexts except for a limited-size prefix of the encoded block. This is helpful to search compressed data, which is not a common feature of other compression methods. The same property allows to design efficient parallel compression algorithms.

Let us first detail the scheme of our algorithm. Let w be a finite binary word and let F(w) be the set of factors of w.

For instance, if w=01001010010

F(w)={$\epsilon$,0,1,00,01,10,001,010,100,101, . . . } where $\epsilon$ denotes the empty word.

Let us take some words in the complement of F(w), i.e. let us take some words that are not factors of w and that we call forbidden. The set of such words AD is called an antidictionary of the language F(w). Antidictionaries can be finite as well infinite.

For instance, if w=01001010010,the words 11, 000 and 10101 are forbidden and the set AD={000,10101,11} is an antidictionary of F(w).

The compression algorithm treats the input word in an online manner. At a certain moment in this process, we have read the word v prefix of w. If there exists a word u=u' x,x $\in$ {0,1}, in the antidictionary AD such that u' is a suffix of v, then surely the letter following v cannot be x, i.e. the next letter is y,y$\neq$x. In other words, we know in advance the next letter y that turns out to be "redundant" or predictable. Remark that this argument works only in the case of binary alphabets.

The main idea in the algorithm we describe is to eliminate redundant letters in order to achieve compression.

In what follows, we first describe the compression algorithm, ENCODER and then the decompression algorithm, DECODER. The word to be compressed is noted w=$a_1$ . . . $a_n$ and its compressed version is denoted by $\gamma$(w).

---

ENCODER (antidictionary AD, word w $\in$ {0,1}*)

1. v $\leftarrow$ $\epsilon$;
2. for a $\leftarrow$ first to last letter of w
3.     v $\leftarrow$ v.a;
4.     if for any suffix u' of v, u'0, u'1 $\notin$ AD
5.         $\gamma$ $\leftarrow$ $\gamma$.a;
6. return (|v|, $\gamma$);

---

As an example, let us run the algorithm ENCODER on the string w=01001010010 with the antidictionary AD={000, 10101,11}. The steps of the treatment are described in the next array by the current values of the prefix $v_i$=$a_1$ . . . $a_i$ of w that has been just considered and of the output $\gamma$(w). In the case of positive answer to the query to the antidictionary AD, the array also indicates the value of the corresponding forbidden word u. The number of times the answer is positive in a run corresponds to the number of bits erased in the encoded state in comparison with the decoded state.

---

| | | |
|---|---|---|
| $\epsilon$ | $\gamma$(w) = $\epsilon$ | |
| $v_1$ = 0 | $\gamma$(w) = 0 | |
| $v_2$ = 01 | $\gamma$(w) = 01 | u = 11 $\in$ AD |
| $v_3$ = 010 | $\gamma$(w) = 01 | |
| $v_4$ = 0100 | $\gamma$(w) = 010 | u = 000 $\in$ AD |
| $v_5$ = 01001 | $\gamma$(w) = 010 | u = 11 $\in$ AD |
| $v_6$ = 010010 | $\gamma$(w) = 010 | |
| $v_7$ = 0100101 | $\gamma$(w) = 0101 | u = 11 $\in$ AD |
| $v_8$ = 01001010 | $\gamma$(w) = 0101 | u = 10101 $\in$ AD |
| $v_9$ = 010010100 | $\gamma$(w) = 0101 | u = 000 $\in$ AD |
| $v_{10}$ = 0100101001 | $\gamma$(w) = 0101 | u = 11 $\in$ AD |
| $v_{11}$ = 01001010010 | $\gamma$(w) = 0101 | |

---

Remark that the function $\gamma$ is not injective. For instance, $\gamma$(010010100)=$\gamma$(0100101001)=0101. In order to have an injective mapping, we can consider the function $\gamma$'(w)=(|w|, $\gamma$(w)). In this case, we can reconstruct the original word w from both y'(w) and the antidictionary.

The decoding algorithm works as follow. The compressed word is $\gamma$(w)=$b_1$ . . . $b_h$ and the length of w is n. The algorithm recovers the word w by predicting the letter following the current prefix v of w already decompressed. If there exists a word u=u' x,x $\in$ {0,1}, in the antidictionary AD such that u' is a suffix of v, then, the output letter is y, y$\neq$x. Otherwise, the next letter is read from the input $\gamma$.

Decompressing the word 0101 to the original text of length 11 considered in the previous example is as follows:

---

| Prefix of compressed word | Current prefix of decompressed word | |
|---|---|---|
| 0 | $v_1$ = 0 | |
| 01 | $v_2$ = 01 | u = 11 $\in$ AD |
| 01 | $v_3$ = 010 | |
| 010 | $v_4$ = 0100 | u = 000 $\in$ AD |
| 010 | $v_5$ = 01001 | u = 11 $\in$ AD |
| 010 | $v_6$ = 010010 | |
| 0101 | $v_7$ = 0100101 | u = 11 $\in$ AD |
| 0101 | $v_8$ = 01001010 | u = 10101 $\in$ AD |
| 0101 | $v_9$ = 010010100 | u = 000 $\in$ AD |
| 0101 | $v_{10}$ = 0100101001 | u = 11 $\in$ AD |
| 0101 | $v_{11}$ = 01001010010 | of length 11. |

---

DECODER (antidictionary AD, integer n, word $\gamma$ $\in$ {0,1}*)

1. v $\leftarrow$ $\epsilon$;
2. while |v| < n
3.     if for some u' suffix of v and x $\in$ {0,1}, u'x $\in$ AD
4.         v $\leftarrow$ v.$\neg$x;
5.     else
6.         b $\leftarrow$ next letter of $\gamma$;
7.         v $\leftarrow$ v.b;
8. return (v);

---

The antidictionary AD must be structured in order to answer to the following query on a word v: does there exist a word u=u' x,x $\in$ {0,1}, in AD such that u' is a suffix of v? In case of a positive answer, the output should also include the letter y defined by y$\neq$x.

Actually, our compression method erases some characters and the decompression reconstructs them. For instance in previous example, the input string is $01\overline{0}0\overline{10}10\overline{0}\overline{10}$ where bars indicate the letters erased in the compression algorithm.

In this approach, the encoder must send to the decoder the length of the word |w|, the compressed word $\gamma$(w) as well the antidictionary, in the case the decoder has not yet a copy of the antidictionary.

In order to have a good compression rate, we need to minimize in particular the size of the antidictionary. Remark that if there exists a forbidden word u=u' x,x $\in$ {0,1}, in the antidictionary such that u' is also forbidden, then our algorithm will never use this word u in the algorithms. So that we can erase this word from the antidictionary without any loss for the compression of w.

This argument leads to introduce the notion of minimal forbidden word with respect to a factorial language L, notion that is discussed in the next section.

The implementation of finite antidictionaries will now be described. The queries on the antidictionary required by the algorithm of the encoding and of the decoding are realized as follows. We build the deterministic automaton accepting the words having no factor in the antidictionary. Then, while reading the text to encode, if a transition leads to a sink state, the output is the other letter. What remains to explain is how the automaton is built from the antidictionary.

The wanted automaton accepts a factorial language L. Recall that a language L is factorial if L satisfies the following property: for any words, u, v, uv ∈ L and v ∈ L.

The complement language $L^c = A^* \backslash L$ is a (two-sided) ideal of $A^*$. Denoting by MF(L) the base of this ideal, we have $L^c = A^*$ MF(L)$A^*$. The set MF(L) is called the set of minimal forbidden words for L. A word v ∈ $A^*$ is forbidden for the factorial language L if v ∉ L, which is equivalent to say that v occurs in no word of L. In addition, v is minimal if it has no proper factor that is forbidden.

One can note that the set MF(L) uniquely characterizes L, just because $$L = A^* \backslash A^* MF(L) A^* \qquad (1)$$

Indeed, there is a duality between factorial and anti-factorial languages, because we also have the equality:

$$MF(L) = AL \cap LA \cap (A^* \backslash L). \qquad (2)$$

As a consequence of both equalities (1) and (2), we get the following proposition.

Proposition 1

For a factorial language L, languages L and MF(L) are simultaneously rational, that is L ∈ Rat($A^*$) if MF(L) Rat($A^*$).

The set MF(L) is an anti-factorial language or a factor code, which means that it satisfies: ∀u, v ∈ MF(L) u≠v=>u is not a factor of v, property that comes from the minimality of words of MF(L).

We introduce a few more definitions.

Definition 1

A word v ∈ $A^*$ avoids the set M, M ⊆ $A^*$, if no word of M is a factor of v, (i.e. if v ∉ $A^*$ M $A^*$). A language L avoids M if every word of L avoids M.

From the definition of MF(L), it readily comes that L is the largest (according to the subset relation) factorial language that avoids MF(L). This shows that for any anti-factorial language M, there exists a unique factorial language L(M) for which M=MF(L). The next remark summarizes the relation between factorial and anti-factorial languages.

Remark 1

There is a one-to-one correspondence between factorial and anti-factorial languages. If L and M are factorial and anti-factorial languages respectively, both equalities hold: MF(L(M))=M and L(MF(L))=L.

Finally, with a finite anti-factorial language M, we associate the finite automaton A(M) as described below. The automaton is deterministic and complete and, as shown at the end of the section by Theorem 1, it accepts the language L(M).

The automaton A(M) is the tuple (Q, A, i, T, F) where
  the set Q of states is {w|w is a prefix of a word in M},
  A is the current alphabet,
  the initial state i is the empty word ε,
  the set T of terminal states is Q\M.

States of A(M) that are words of M are sink states. The set F of transitions is partitioned into the three (pairwise disjoint) sets $F_1$, $F_2$ and $F_3$ defined by:

$F_1$={(u, a, ua)|ua ∈ Q, a ∈ A} (forward edges or tree edges),
$F_2$={(u, a, v)|u ∈ Q\M, a ∈A, ua ∉ Q, v longest suffix of ua in Q} (backward egdes)
$F_3$={(u, a, u)|u ∈ M, a ∈ A} (loops on sink states).

The transition function defined by the set F of arcs of A(M) is noted δ.

The next result is provided in [8].

Theorem 1

For any anti-factorial language M, A(M) accepts the language L(M).

The above definition of A(M) turns into the algorithm below, called L-AUTOMATON, that builds the automaton from a finite anti-factorial set of words. The input is the trie Γ that represents M. It is a tree-like automaton accepting the set M and, as such, it is noted (Q, A, i, T, δ').

In view of Equality 1, the design of the algorithm remains to adapt the construction of a pattern matching machine (see [1] or [7]). The algorithm uses a function f called a failure function and defined on states of Γ as follows. States of the trie Γ are identified with the prefixes of words in M. For a state au (a ∈ A, u ∈ $A^*$), f(au) is δ'(i, u), quantity that may happen to be u itself. Note that f(i) is undefined, which justifies a specific treatment of the initial state in the algorithm.

---

L-AUTOMATON (trie Γ = (Q, A, i, T, δ'))

1.  for each a ∈ A
2.    If δ'(i, a) defined
3.      set δ(i, a) = δ'(i, a);
4.      set f(δ(i, a)) =i;
5.    else
6.      set δ(i, a) =i;
7.  for each state p ∈ Q\{i} in width-first search and each a ∈ A
8.    if δ'(p, a) defined
9.      set δ(p, a) = δ'(p, a);
10.     set f(δ(p, a)) = δ(f(p) a);
11.   else if p ∉ T
12.     set δ(p, a) = δ(f(p) a);
13.   else
14.     set δ(p, a) = p;
15. return (Q, A, i, Q\T, δ)

---

Example

Figure 2:
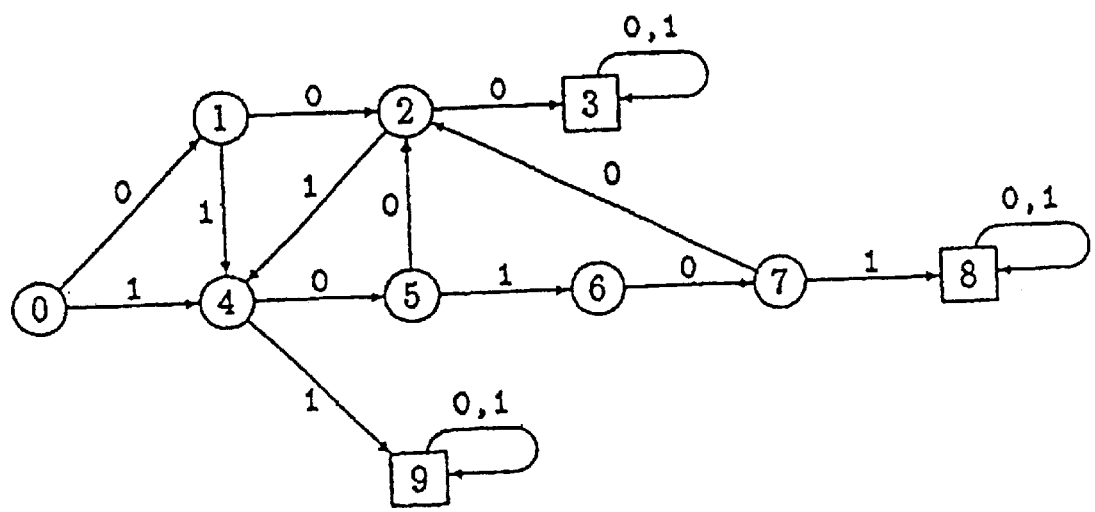
FIG. 2 is a scheme of an automaton accepting the words that avoid the set (000, 10101, 11). Squares represent non-terminal states named sink states.
Figure 3:
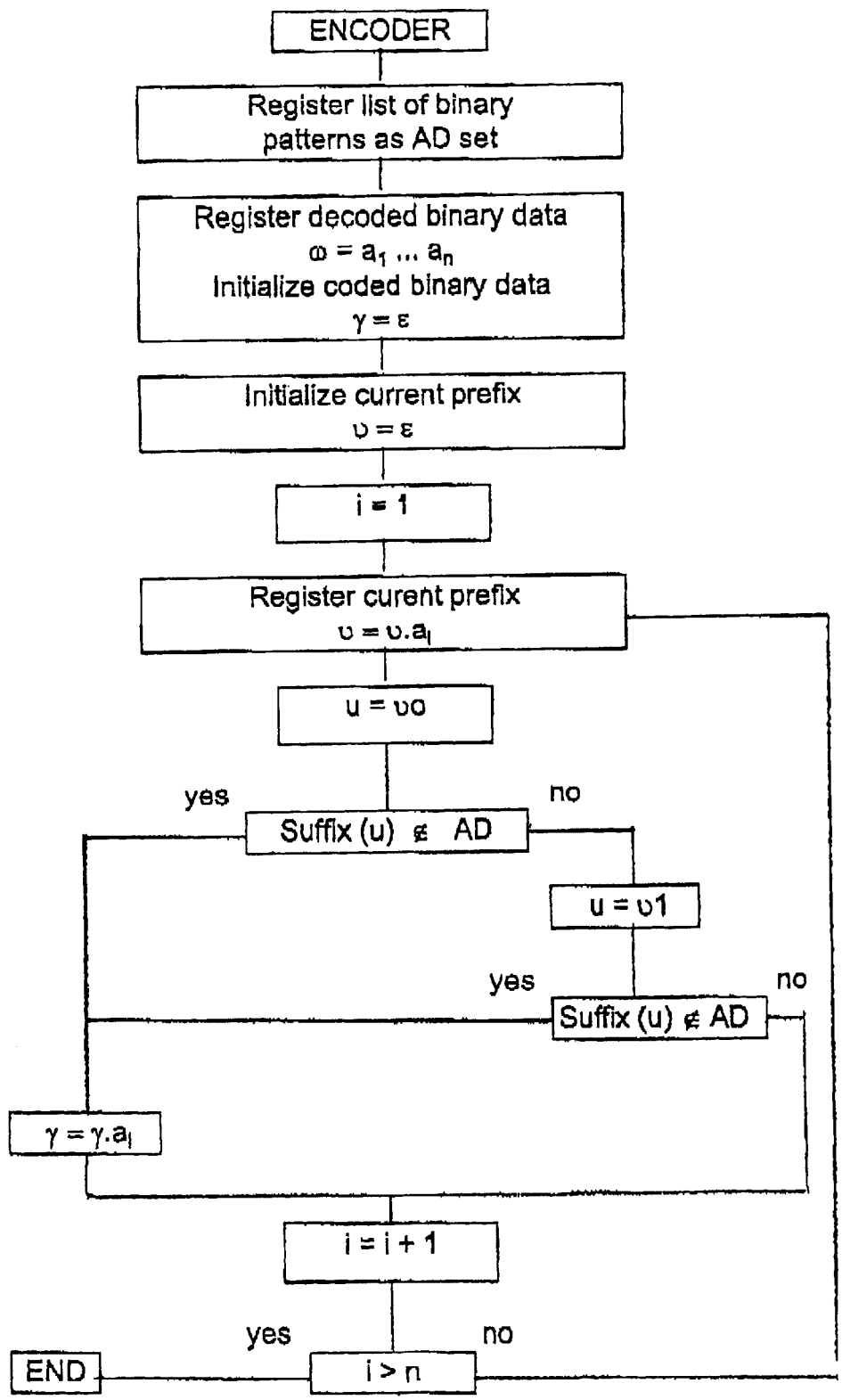
FIG. 3 is a flow chart for an encoding procedure of the present invention.

FIG. 1 displays the trie that accepts M={000,10101,11}. It is an anti-factorial language. The automaton produced from the trie by algorithm L-AUTOMATON is shown in FIG. 2. It accepts all the words avoiding M.

Theorem 2

Let Γ be the trie of an anti-factorial language M. Algorithm L-AUTOMATON builds a complete deterministic automaton accepting L(M).

Proof

The automaton produced by the algorithm has the same set of states as the input tries. It is clear that the automaton is deterministic and complete.

Let u ∈ $A^+$ and p=δ (i, u). A simple induction on |u| shows that the word corresponding to f(p) is the longest proper suffix of u that is a prefix of some word in M. This notion comes up in the definition of the set of transitions $F_2$ in the automaton A(M). Therefore, the rest of the proof just remains to check that instructions implement the definition of A(M).

Theorem 3

Algorithm L-AUTOMATON runs in time $O(|Q| \times |A|)$ on input $\Gamma=(Q, A, i, T, \delta')$ if transition functions are implemented by transition matrices.

Proof

If transition functions $\delta$ and $\delta'$ are implemented by transition matrices, access to or definition of $\delta(p, a)$ (p state, $a \in A$) are realized in constant amount of time. The result follows immediately.

The algorithm L-AUTOMATON can be adapted to test whether $\Gamma$ represents an anti-factorial set, to generate the trie of the anti-factorial language associated with a set of words, or even to build the automaton associated with the anti-factorial language corresponding to any set of words.

From the automaton A(M), we can easily construct a (finite-state) transducer B(M) that realizes the compression algorithm ENCODER, i.e. that computes the function $\gamma$.

The input part of B(M) coincides with A(M) and the output is given as follows: if a state of A(M) has two outgoing edges, then the output labels of these edges coincide with their input label; if a state of A(M) has only one outgoing edge, then the output label of this edge is the empty word.

The transducer B(M) works as follows on an input string w. Consider the (unique) path in B(M) corresponding to w. The letters of w that correspond to an edge that is the unique outgoing edge of a given state are erased; other letters are unchanged.

We can then state the following theorem.

Theorem 4

Algorithm ENCODER is realized by a sequential transducer (generalized sequential machine).

As to concern the algorithm DECODER, remark (see Section 2) that the function $\gamma$ is not infective and that we need some additional information, for instance the length of the original uncompressed word, in order to reconstruct it without ambiguity. We show that DECODER can be realized by the same transducer as above, by interchanging input and output labels (denote it by B'(M)), with a supplementary instruction to stop the decoding.

Let $Q=Q_1 \cup Q_2$ be a partition of the set of states Q, where $Q_i$ is the set of states having i outpoing edges (i=1, 2). For any $q \in Q_1$, define $p(q)=(q, q_1, \ldots, q_r)$ as the unique path in the transducer for which $q_j \in Q_1$ for j<r and $q_r \in Q_2$.

Given an input word $v=b_1 b_2 \ldots b_m$, there exists in B'(M) a unique path i, $q_1, \ldots, q_m'$ such that $q_{m'-1} \in Q_2$ and the transition from $q_{m'-1}$ to $q'_m$ corresponds to the input letter $b_m$.

If $q_m' \in Q_2$, then the output word corresponding to this path in B'(M) is the unique word w such that $\gamma(w)=v$.

If $q_m' \in Q_1$, then we can stop the run of the decoding algorithm realized by B'(M) in any state $q \in p(q_m')$ and, for different states, we obtain different decoding. So, we need a supplementary information (for instance the length of the original uncompressed word) to perform the decoding. In this sense, we can say that B'(M) realizes sequentially the algorithm DECODER.

The constructions and the results given above can be generalized also to the case of rational antidictionaries or, equivalently, when the set of words "produced by the source" is a rational language. In these cases it is not, in a strict sense, necessary to introduce explicitly antidictionaries and all the methods can be presented in terms of automata and transducers, as above. Remark however that the presentation given in Section 2 in terms of antidictionaries is more general, since it includes the non rational case. Moreover, even in the finite case, the constructions of automata and transducers from a fixed text, given in the next section, makes an explicit use of the notion of minimal forbidden words and of antidictionaries.

In the sequel, we prove a synchronization of automata built from finite antidictionaries, as described above. This property also "characterizes" in some sense finite antidictionaries. This property is a classical one and it is of fundamental importance in practical applications.

We start with a definition.

Definition 2

Given a deterministic finite automaton A, we say that a word $w=a_1 \ldots a_n$ is synchronizing for A if, whenever w represents the label of two paths $(q_1, a_1, q_2) \ldots (q_n, a_n, q_{n+1})$ and $(q'_1, a_1, q'_2) \ldots (q'_n, a_n, q'_{n+1})$ of length n, then the two ending states $q_{n+1}$ and $q'_{n+1}$ are equal.

If L(A) is factorial, any word that does not belong to L(A) is synchronizing. Clearly in this case, synchronizing words in L(A) are much more interesting.

Remark also that, since A is deterministic, if w is synchronizing for A, then any word $w'=wv$ that has as prefix is also synchronizing for A.

Definition 3

A deterministic finite automaton A is local if there exists an integer n such that any words of length n is synchronizing. Automaton A is also called n-local.

Remark that if A is n-local then it is m-local for any $m \geq n$.

Given a finite antifactorial language M, let A(M) be the automaton associated with M as described in Section 4. Recall that it has no sink state, that all states are terminal, and that L(A(M)) is factorial.

Theorem 5

Let M be a finite antifactorial antidictionary and let n be the length of the longest word in M. Then automaton A(M) associated to M is (n−1) local.

Proof

Let $u=a_1 \ldots a_{n-1}$ be a word of length n−1. We have to prove that u is synchronizing. Suppose that there exists two paths $(q_1, a_1, q_2) \ldots (q_{n-1}, a_{n-1}, q_n)$ and $(q'_1, a_1, q'_2) \ldots (q'_{n-1}, a_{n-1}, q'_2)$ of length n−1 labelled by u. We have to prove that the two ending states $q_n$ and $q'_n$ are equal. Recall that states of A are words, and, more precisely, they are the proper prefixes of words in M. A simple induction on i, $1 \leq i \leq n$ shows that $q_i$ (respectively $q'_i$) "is" the longest suffix of the word $q_1 a_1 \ldots a_i$ (respectively $q'_1 a_1 \ldots 1_i$) that is also a "state", i.e. a proper prefix of a word in M. Hence, $q_n$ (respectively $q'_n$) is the longest suffix of the word $q_1 u$ (respectively $q'_1 u$) that is also a proper prefix of a word in M. Since all proper prefixes of words in M have length at most n−1, both $q_n$ and $q'_n$ have length at most n−1. Since u has length n−1, both they are the longest suffix of u that is also a proper prefix of a word in M, i.e. they are equal.

The previous theorem admits a "converse" that we state without proof and that shows that locality characterizes in some sense finite antidictionaries (cf. Propositions 2.8 and 2.14 of [3]).

Theorem 6

If automaton A is local and L(A) is a factorial language, then there exists a finite antifactorial language M such that L(A)=L(M).

Let M be an antifactorial and let n be the length of the longest word in M. Let also $w=w_1uvw_2 \in L(M)$ with (u)=n−1 and let $\gamma(w)=y_1y_2y_3$ be the word produced by our encoder of Section 2 with input M and w. The word $y_1$ is the word produced by our encoder after processing $w_1u$, the word $y_2$ is the word produced by our encoder after processing v and the word $y_3$ is the word produced by our encoder after processing $w_2$.

The proof of next theorem is an easy consequence of previous definitions and of the statement of Theorem 5.

Theorem 7

The word $y_2$ depends only on the word uv and it does not depend on the context of it, $w_1$ and $w_2$.

The property stated in the theorem has an interesting consequence for the design of pattern matching algorithms on words compressed by the algorithm ENCODER. It implies that, to search the compressed word for a pattern, it is not necessary to decode the whole word. Just a limited left context of an occurrence of the pattern needs to be processed. This is not a common feature of other compression methods. They have to split the input to get the same advantage, but this may weaken the efficiency of the final compression algorithm.

The same property allows the design of highly parallizable compression algorithms. The idea is that the compression can be performed independently and in parallel on any block of data. If the text to be compressed is parsed into blocks of data in such a way that each block overlaps the next block by a length not smaller than the length of the longest word in the antidictionary, then it is possible to run the whole compression process.

Indeed, the antidictionary M defines naturally a source S(M) in the following way. Let A(M) be the automaton constructed in the previous section and that recognizes the language L(M) and let us eliminate the sink states and edges going to them. Since there is no possibility of misunderstanding, we denote the resulting automaton by A(M) again. To avoid trivial cases, we suppose that in this automaton, all the states have at least one outgoing edge. Recall that, since our algorithms work on binary alphabet, all the states have at most two outgoing edges.

For any state of A(M) with only one outgoing edge, we give to this edge probability 1. For any state of A(M) with two outgoing edges, we give to these edges probability ½. This defines a deterministic Markov source, denoted S(M). A binary Markov source with this probability distribution is called an equilibrated source.

Remark that our compression algorithm is defined exactly for all the words "emitted" by S(M).

In what follows, we suppose that the graph of the source S, i.e. the graph of automaton A(M) is strongly connected. The results that we prove can be extended to the general case by using standard techniques of Markov Chains.

It is known that the entropy H(S) of a deterministic Markov source S is $$H(S)=-\Sigma^n_{i,j=1}\mu_i\gamma_{i,j} \log_2(\gamma_{i,j}),$$

where $(\gamma_{ij})$ is the stochastic matrix of S and $(\mu_1, \ldots \mu_n)$ is the stationary distribution of S.

We first start with two preliminary lemmas.

Lemma 1

The entropy of an equilibrated source S is given by $H(S)=\Sigma_{i\in D}\mu_i$ where D is the set of all states that have two outgoing edges.

Proof

By definition:

$$H(S)=-\Sigma^n_{i,j=1}\mu_i\gamma_{i,j} \log_2(\gamma_{i,j}).$$

If i is a state with only one outgoing edge, by definition this edge must have probability 1. Then $\Sigma_j\mu_i\gamma_{ij} \log_2(\gamma_{ij})$ reduces to $\mu_i \log_2(1)$, that is equal to 0. Hence:

$$H(S)=-\Sigma_{i\in D}\Sigma^n_{j=1}\mu_i\gamma_{i,j} \log_2(\gamma_{i,j}).$$

Since from $i \in D$, there are exactly two outgoing edges having each probability ½, one has:

$$H(S)=-\Sigma_{i\in D}2\mu_i(½)=\Sigma_{i\in D}\mu_i$$

as stated.

Lemma 2

Let $w=a_1 \ldots a_m$ be a word in L(M) and let $q_1 \ldots q_{m+1}$ be the sequence of states in the path determined by w in A(M) starting from the initial state. The length of $\gamma(w)$ is equal to the number of states $q_i$, i=1, ... m, that belong to D, where D is the set of all states that have two outgoing edges.

Proof

The statement is straightforward from the description of the compression algorithm and the implementation of the antidictionary with automaton A(M).

Next lemma reports a well known "large deviation" result (cf. Theorem 1.4.3 of [12]).

Let $q=q_1, \ldots, q_m$ be the sequence of m states of a path of A(M) and let $L_{m,i}(q)$ be the frequency of state $q_i$ in this sequence, i.e. $L_{m,i}(q)=m_i/m$, where $m_i$ is the number of occurrences of $q_i$ in the sequences q. Let also:

$$X_m(\epsilon)=\{q|q \text{ has } m \text{ states and } \max_i|L_{m,i}(q)-\mu_i|\geq\epsilon\},$$

where q represents a sequence of m states of a path in A(M).

In other words, $X_m(\epsilon)$ is the set of all sequences of states representing path in A(M) that "deviate" at least of $\epsilon$ in at least one state $q_i$ from the theoretical frequency $\mu_i$.

Lemma 3

For any $\epsilon>0$, the set $X_m(\epsilon)$ satisfies the equality:

$$\lim \frac{1}{m}\log_2 Pr(Xm(\epsilon)) = -c(\epsilon),$$

where $c(\epsilon)$ is a positive constant depending on $\epsilon$.

We now state and prove the main theorem of this section. We prove that for any $\epsilon$, the probability that the compression rate $\tau(v)=|\gamma(v)|/|v|$ of a string of length n is greater than $H(S(M))+\epsilon$, goes exponentially to zero. Hence, as a corollary, almost surely the compression rate of an infinite sequence emitted by S(M) reaches the entropy H(S(M)), that is the best possible result.

Let $K_m(\epsilon)$ be the set of words w of length m such that the compression rate $\tau(v)=|\gamma(v)|/|v|$ is greater than $H(S(M))+\epsilon$.

Theorem 8

For any $\epsilon>0$, there exists a real number $r(\epsilon), 0<r(\epsilon)<1$, and an integer $\overline{m}(\epsilon)$ such that for any $m>\overline{m}(\epsilon), Pr(K_m(\epsilon))\leq r(\epsilon)^m$.

Proof

Let w be a word of length m in the language $L(M)$ and let $q_1 \ldots q_{m+1}$ be the sequence of states in the path determined by w in $A(M)$ starting from the initial state. Let $q=(q1, \ldots q_m)$ be the sequence of the first m states. We know, by Lemma 2, that the length of $\gamma(w)$ is equal to the number of states $q_i, i=1, \ldots m$, in q that belong to D, where D is the set of all states having two outgoing edges.

If w belong to $K_m(\epsilon)$, i.e. if the compression rate $\tau(v)=|\gamma(v)|/|v|$ is greater than $H(S(M))+\epsilon$, then there must exist an index j such that $L_{mj}(q)>\mu_j+\epsilon/d$, where d is the cardinality of the set D. In fact, if for all j, $L_{mj}(q)\leq\mu_j+\epsilon/|D|$ then, by definitions and by Lemma 1, $$\tau(v)=\Sigma_{j\in D}L_{mj}(q)\leq\Sigma_{j\in D}\mu_j+\epsilon=H(S(M))+\epsilon,$$

a contradiction. Therefore, the sequence of states q belongs to $X_m(\epsilon/d)$.

Hence $Pr(K_m(\epsilon))\leq Pr(X_m(\epsilon/d))$.

By Lemma 3, there exists an integer $\overline{m}(\epsilon)$ such that for any $m>\overline{m}(\epsilon)$, one has:

$$\frac{1}{m}\log_2 Pr\left(X_m\left(\frac{\epsilon}{d}\right)\right) \leq -\frac{1}{2}c\left(\frac{\epsilon}{d}\right).$$

Then, $Pr(K_m(\epsilon))\leq 2^{-(1/2)c(\epsilon/d)m}$. If we set $r(\epsilon)=2^{-(1/2)c(\epsilon/d)}$, the statement of the theorem follows.

Corollary 1

The compression rate $\tau(x)$ of an infinite sequence x emitted by the source $S(M)$ reaches the entropy $H(S(M))$ almost surely.

In practical applications, the antidictionary is not a priori given but it must be derived either from the text to be compressed or from a family of texts belonging to the same source to which the text to be compressed is supposed to belong.

There exist several criteria to build efficient antidictionaries that depend on different aspects or parameters that one wishes to optimize in the compression process. Each criterium gives rise to different algorithms and implementations.

We present a simple construction to build finite antidictionaries. It is the base on which several variations are developed. It can be used to build antidictionaries for fixed sources. In this case, our scheme can be considered as a compressor generator (compressor compiler). In the design of a compressor generator, or compressor compiler, statistic considerations play an important role.

Algorithm BUILD-AD below builds the set of minimal forbidden words of length k (k>0) of the word w. It takes as input an automaton accepting the words that have the same factors of length k (or less) than w, i.e. accepting the language:

$$L=\{x \in \{0,1\}^*|(u \in F(x) \text{ and } \|\leq k)=>u \in F(w)\}.$$

The preprocessing of the automaton is done by the algorithm BUILD-FACT whose central operation is described by the function NEXT. The automaton is represented by both a trie and its failure function f. If p is a node of the trie associated with the word av, $v \in \{0,1\}$, f(p) is the node associated with v. This is a standard technique used in the construction of suffix trees (see [7] for example). It is used here in algorithm BUILD-AD (line 4) to test the minimality of forbidden words according to the equality 2.

| BUILD-FACT (word w ∈ {0,1}*, integer k > 0) |
| --- |
| 1.    i ← new state; Q ← {i}; |
| 2.    level (i) ← 0; |
| 3.    p ← i; |
| 4.    while not end of string w |
| 5.        a ← next letter of w; |
| 6.        p ← NEXT (p, a, k); |
| 7.    return trie (Q, i, Q, δ), function f; |

| NEXT (state p, letter a, integer k > 0) |
| --- |
| 1.    if δ(p, a) defined |
| 2.        return δ(p, a); |
| 3.    else if level (p) = k |
| 4.        return NEXT (f(p), a, k); |
| 5.    else |
| 6.        q ← new state; Q ← Q ∪ {q}; |
| 7.        level (q) ← level (p) + 1; |
| 8.        δ(p, a) ← q; |
| 9.        if (p = i) f(q) ← i; else f(q) ← NEXT (f(p), a, k); |
| 10.   return q; |

| BUILD-AD (trie (Q, i, Q, δ), function f, integer k > 0) |
| --- |
| 1.    T ← ∅; δ' ← δ; |
| 2.    for each p ∈ Q, 0 < level (p) < k, in width-first order |
| 3.        for a ← 0 then 1 |
| 4.           if δ(p, a) undefined and δ(f(p), a) defined |
| 5.              q ← next state; T ← T ∪ {q}; |
| 6.              δ'(p, a) ← q; |
| 7.    Q ← Q\{states of Q from which no δ'-path leads to T} |
| 8.    return trie (Q ∪ T, i, T, δ'); |

The above construction gives rise to a static compression scheme in which we need to read twice the text: the first time to construct the antidictionary M and the second time to encode the text.

Informally, the encoder sends a message z of the form (x, y, σ(n)) to the decoder, where x is a description of the antidictionary M, y is the text coded according to M, as described in Section 2, and σ(n) is the usual binary code of the length n of the text. The decoder first reconstructs from x the antidictionary and then decodes y according to the algorithm in Section 2. We can choose the length k of the longest minimal forbidden word in the antidictionary such that, by coding the trie associated to M with standard techniques, one has that $|x|=\sigma(n)$. Since the compression rate is the size $|z|$ of z divided by the length n of the text, we have that $|z|/n=|y|/n+\sigma(n)$. Assuming that for n and k large enough the source $S(M)$, as in Section 4, approximates the source of the text, then, by the results of Section 4, the compression rate is "optimal".

EXAMPLE 1

Let $w=a_1 a_2 \ldots$ be a binary infinite word that is periodic (i.e. there exists integer P>0 such that for any index i, the letter $a_i$ is equal to the letter $a_{i+p}$), and let $w_n$ be the prefix of w of length n.

We want to compress the word $w_n$ following our simple scheme informally described above. Since w has period P, then for any i>P, letter $a_i$ is uniquely determined by the P previous letters. Therefore, we define the antidictionary:

$$M=\{ua|u \in F(w), |u|=P-1, \text{ and } ua \notin F(w)\},$$

where F(w) is the language of all factors of w. Then, it is easy to prove that for any prefix $w_n$ of w, the length of the text y coded using M is constantly equal to P. Hence, the compression rate for $w_n$ is $|z|/n=O(\sigma(n))=O(\log_2(n))$, which means that the method can achieve an exponential compression.

It is possible to generalize the previous example to any binary infinite word, $w=a_1a_2\ldots$, that is ultimately periodic (i.e. there exist integers M>0, P>0 such that for any index $i \geq M$, the letter $a_i$ is equal to the letter $a_{i+p}$).

EXAMPLE 2

This example is a bit more complex, and the compression rate is no more exponential in the size of the text.

We start with the classical recursive definition of finite Fibonacci words $f_n$ (cf. [5]). Let $f_1=0$, $f_2=01$ and let $f_{n+1}=f_nf_{n-1}$ for $n \geq 2$. In particular, we have $f_3=010$, $f_4=01001$ and $f_5=01001010$. The infinite Fibonacci word f is the limit of the sequence of the finite Fibonacci words, i.e. the unique infinite words that have all the $f_n$ as prefixes. It is known that the length $|f_n|$ is the n-th Fibonacci number and, consequently, $\lim |f_n|=\Theta(\phi^n)$ where $\phi=1,618\ldots$ is the golden ratio.

Let L(f) and $L(f_n)$ be the factorial languages composed respectively by all factors of the Fibonacci infinite word f and of the finite Fibonacci word $f_n$. It is known (cf. [16]) that any factor of f of length 4 m contains as factors all factors of length m of the whole word f. In particular, $L(f_n) \cap \{0,1\}^m = L(f) \cap \{0,1\}^m$ for any $m \leq |f_n|/4$. Consequently, the minimal forbidden words of f up to length m are also the minimal forbidden words of $f_n$ up to length m for any $m \leq |f_n|/4$.

If we call $g_n$ to be the prefix of length $|f_n|2$ of $f_n$ for $n \geq 2$, it is known (cf. Example 2 of [4]) that all the minimal forbidden words of L(f) are:

$$\{1g_{2i}1|i \geq 1\} \cup \{0g_{2i+1}0|i \geq 1\},$$

i.e. they are 11, 000, 10101, 00100100, ....

We now compress the word $f_{2n}$ following our simple scheme informally described above. We choose as length k of the longest minimal forbidden word, the number $k=|f_n|$. By previous observations:

$$M=(\{1g_{2i}1|i \geq 1\} \cup \{0g_{2i+1}0|i \geq 1\}) \cap \{0,1\}^*,$$

and consequently it is not difficult to prove that the size of a standard coding x of the trie associated to M is $x=O(|f_n|)=O((\phi^n)=o(|f_{2n}|)$.

It is possible to prove that the size of the compressed version y of $f_{2n}$ by using our algorithm with the antidictionary M is $|y|=O(|f_n|)$.

Therefore, the global compression rate is $O(|f_n|/|f_{2n}|)=O((1/\phi)^n)$. This means that the compression ratio converges exponentially to zero as n goes up to infinity.

Till now, we presented a static compression scheme in which we need to read twice the text. Starting from the static scheme, several variations and improvements can be proposed. These variations are all based on clever combinations of two elements that can be introduced in our model:

a) statistic considerations, b) dynamic approaches.

These are classical features that are sometimes included in other data compression methods.

Statistic considerations are used in the construction of antidictionaries. If a forbidden word is responsible of "erasing" few bits of the text in the compression algorithm of Section 2 and its "description" as an element of the antidictionary is "expensive", then the compression rate improves if it is not included in the antidictionary. On the contrary, one can introduce in the antidictionary a word that is not forbidden but that occurs very rarely in the text. In this case, the compression algorithm will produce some "mistakes". In order to have a lossless compression, the encoder must take account of such mistakes and must also send them to the decoder. Typical "mistakes" occur in the case of antidictionaries built for fixed sources and in the dynamic approach. Even with mistakes, assuming that the mistakes are rare with respect to the longest word (length) of the antidictionary, our compression scheme preserves the synchronization property for fixed sources.

In the dynamic approach, we construct the antidictionary and we encode the text at the same time. The antidictionary is constructed (also with statistical consideration) by taking account of (a part of) the text previously read.

We have realized some prototypes of the compression and decompression algorithms. They also implement the dynamic version of the method. They have been tested on the Calgary Corpus, and the next table reports the size of compressed files. The total size of compressed data is equivalent to most common compressors such as pkzip.

| File | Compressed size |
| --- | --- |
| bib | ern, |
| book1 | |
| book2 | |
| geo | ation |
| news | oppo |
| obj1 | e to |
| obj2 | he |
| paper1 | |
| with | y |
| | rmati |
| fix | n of |
| a | he |
| istere | ister |
| d | 22695 |
| Total | 1,107094 |

The advantages of the scheme of our invention are:

fast at decompressing data, it is similar to a compressor generator (compressor compiler) for fixed sources, fast at compressing data for fixed sources, it has a synchronization property in the case of finite antidictionaries that leads to parallel compression and to search engines on compressed data.

We are considering several generalizations:

compressor scheme and implementation of antidictionaries on more general alphabets, the use of lossy compression especially to deal with images, the combination of the scheme of the invention with other compression scheme. For instance using both dictionaries and antidictionaries like positive and negative sets of examples as in Learning Theory, the design of chips dedicated to fixed sources.

What is claimed is:

1. Data encoding process in which data are converted from a decoded state into an encoded state in which:

the data, both in the encoded state and in the decoded state, are in the form of a stream of binary information, by processing the decoded string of data from left to right, its current prefix and the next binary information being considered, a list of binary patterns being registered, in which for each is emphasized the last binary information and the corresponding prefix, a comparison is made between the current prefix of the decoded string and the prefixes of registered patterns, characterized in that the list of patterns is a set of patterns that do not occur and that when a prefix of the decoded string match with a prefix of a registered pattern, the next binary information of the decoded string is omitted from the decoded stream to make the encoded stream.

2. Data decoding process in which data are converted from an encoded state into a decoded state in which:

the data, both in the encoded state and in the decoded state, are in the form of a stream of binary information, by processing the encoded string of data from left to right, its current prefix being considered, a list of binary patterns being registered, in which for each is emphasized the last binary information and the corresponding prefix, a comparison is made between the current prefix of the decoded string and the prefixes of registered patterns, characterized in that the list of patterns is a set of patterns that do not occur and that when a prefix of the decoded string match with a prefix of a registered pattern, a binary information opposite to the next binary information of the registered matching pattern is inserted in the encoded stream to make the decoded stream.

3. Data conversion process according to claim 1, characterized in that the list of registered patterns is finite.

4. Data conversion process according to claim 1, characterized in that patterns are binary words.

5. Data conversion process according to claim 1, characterized in that an algorithm is used to compute the list of registered patterns.

6. Data conversion process according to claim 5, in which during the encoding process, the data stream is read a first time to construct the list of registered patterns and a second time to convert said data stream.

7. Data conversion process according to any of claim 1, in which an encoder sends a message z in the form $(x, y, \sigma(n))$ to a decoder, where x is a description of a list of the registered patterns, y is the encoded data stream and $\sigma(n)$ is the usual binary code of the length n of the data stream.

8. Data conversion process according to claim 2, characterized in that the list of registered patterns is finite.

9. Data conversion process according to claim 2, characterized in that patterns are binary words.

10. Data conversion process according to claim 2, characterized in that an algorithm is used to compute the list of registered patterns.

11. Data conversion process according to claim 10, in which during the encoding process, the data stream is read a first time to construct the list of registered patterns and a second time to convert said data stream.

12. Data conversion process according to claim 2, in which an encoder sends a message z in the form $(x, y, \sigma(n))$ to a decoder, where x is a description of a list of the registered patterns, y is the encoded data stream and $\sigma(n)$ is the usual binary code of the length n of the data stream.

* * * * *

UNITED STATES PATENT AND TRADEMARK OFFICE
CERTIFICATE OF CORRECTION

PATENT NO. : 6,239,727 B1
DATED : May 29, 2001
INVENTOR(S) : Crochemore et al.

It is certified that error appears in the above-identified patent and that said Letters Patent is hereby corrected as shown below:

<u>Title page,</u>
The listing of the assignees, Item [73], should include the following two assignees:
-- CENTRE NATIONAL DE LA RECHERCHE SCIENTIFIQUE and UNIVERSITA' DEGLI STUDI DI PALERMO --.

Signed and Sealed this

Second Day of October, 2001

Attest:

NICHOLAS P. GODICI
Attesting Officer
Acting Director of the United States Patent and Trademark Office